United States Patent [19]

Chiba et al.

[11] Patent Number: 5,026,239
[45] Date of Patent: Jun. 25, 1991

[54] MASK CASSETTE AND MASK CASSETTE LOADING DEVICE

[75] Inventors: Yuji Chiba, Isehara; Hidehiko Fujioka, Atsugi; Nobutoshi Mizusawa, Yamato; Takao Kariya, Hino; Isamu Shimoda, Zama, all of Japan

[73] Assignee: Canon Kabushiki Kaisha, Tokyo, Japan

[21] Appl. No.: 402,601

[22] Filed: Sep. 5, 1989

[30] Foreign Application Priority Data

Sep. 6, 1988 [JP] Japan .................................. 63-221269
Sep. 6, 1988 [JP] Japan .................................. 63-221270

[51] Int. Cl.$^5$ ..................... B65G 65/30; B65H 1/00; G21K 5/00
[52] U.S. Cl. .................................... 414/217; 414/222; 414/331; 378/34; 378/35; 378/204
[58] Field of Search .............. 414/796.7, 796.8, 796.5, 414/217, 416, 222, 331, 540; 118/718; 378/34, 35, 208, 204, 209

[56] References Cited

U.S. PATENT DOCUMENTS 4,815,912 3/1989 Maney et al. ...................... 414/217

FOREIGN PATENT DOCUMENTS

WO8704043 7/1987 PCT Int'l Appl. .

OTHER PUBLICATIONS

DeGennaro, et al. "Clean Environment Handling System," IBM Technical Disclosure Bulletin, vol. 13, No. 3, 8/1970, pp. 627 through 628.

Primary Examiner—Edward P. Westin
Assistant Examiner—Don Wong
Attorney, Agent, or Firm—Fitzpatrick, Cella, Harper & Scinto

[57] ABSTRACT

A mask cassette and mask cassette loading device, suitably usable in an X-ray exposure apparatus for exposing a wafer to a mask with X-rays contained in synchrotron radiation, to print a pattern of the mask on the wafer, are disclosed. The mask cassette includes a base for accommodating a plurality masks and a cover which can be separated from and coupled to the base only in one direction. When the two are coupled by a locking mechanism, the cassette can be completely closed against atmospheric pressure. The mask cassette loading device includes a common mechanism which serves to release the locking mechanism of the cassette and also, to move the cassette base relative to the cover. Thus, with a simple and compact structure, the protection and replacement of X-ray masks are ensured with certainty.

13 Claims, 7 Drawing Sheets

MASK CASSETTE AND MASK CASSETTE LOADING DEVICE

FIELD OF THE INVENTION AND RELATED ART

This invention relates to a container and a loading device for the same. More particularly, the invention is concerned with a mask cassette and a mask cassette loading device suitably usable, for example, in an X-ray exposure apparatus for exposing a semiconductor wafer to a mask with X-rays contained in a synchrotron radiation beam to print, on the semiconductor wafer, a pattern prepared on the mask for manufacture of semiconductor microcircuit devices.

In semiconductor device manufacturing exposure apparatuses, usually each reticle or mask (hereinafter simply "mask") is held in a container (hereinafter "cassette casing") for keeping or protection of the same against dust. Cassette casings accommodating respective masks are adapted to be mounted into a mask loader, attached to the exposure apparatus and having portions of a number as required for the exposure process.

In the exposure operation, for sequential loading of the masks from the mask loader, first, the exposure apparatus operates to select a desired cassette casing in the mask loader. The selected cassette casing removed from the mask loader by means of a mask conveying mechanism. Thereafter, an access window of the cassette casing is opened by means of a part of the mask conveying mechanism, and the mask in the thus opened cassette casing is taken out by a mask changer of the mask conveying mechanism and is conveyed to a predetermined position. After the exposure is completed, the mask is conveyed by the mask conveying mechanism back into the cassette casing, and the next cassette casing is prepared.

The mask loader is actuated in a specified atmosphere. The masks are stored in respective cassette casings, one by one. Accordingly, such a cassette casing in which a desired mask is accommodated is selected by a selecting device and, then, a door of the selected cassette casing is opened by means of an opening device which is a part of the conveying mechanism. Then, the mask in the cassette casing is taken out of the casing by the conveying mechanism and is conveyed to the predetermined position.

On the other hand, each mask to be used in a semiconductor device manufacturing exposure apparatus such as, for example, a stepper or an aligner, comprises a square glass plate on which a pattern is provided by chromium plating. Mask cassettes for accommodating such masks can be classified into two types. One is a type which is used, for example, when each mask is to be directly, by the hands of an operator, introduced into a semiconductor device manufacturing apparatus. Such type of cassette comprises a resin container of a simple structure and is arranged so that plural masks are inserted into and kept in the container, in upstanding attitude.

The other one is a type which is used, for example, when the cassette is to be directly loaded to the semiconductor device manufacturing apparatus. Such a cassette is arranged to accommodate only one mask, laying down therein The cassette has a cover which can be operationally associated with a cassette opening/closing mechanism within the semiconductor device manufacturing apparatus, so that it can be opened and closed Such a cassette is disclosed, for example, in Japanese Laid-Open Patent Application Sho 61-130127, and a resin container is used.

FIG. 7 shows a known type mask cassette.

Denoted in this Figure at CF is a cassette frame; at CM is a major part (base) of the cassette; and at RM is a mask. Each cassette of the described type can accommodate therein one mask, only. Further, it is not structured to provide a completely sealed container.

SUMMARY OF THE INVENTION

In the example described above, the exposure apparatus operates in an atmospheric ambience and only the temperature and humidity of the ambience are controlled. The pressure of the ambience depends on the atmospheric pressure On the other hand, the exposure ambience of an X-ray exposure apparatus, among various exposure apparatuses, is a low vacuum (or low pressure) inert gas. Therefore, there is a difficulty in using the conveying mechanism of the conventional apparatus as a conveying mechanism in an X-ray exposure apparatus.

Further, combining a load locking mechanism for sample replacement in vacuum with the known type conveying mechanism as described, disadvantageously makes the structure complicated.

Additionally, although in a reduction optical exposure apparatus it is relatively easy to take measures for dust or foreign particles, it raises a very serious problem in the X-ray exposure apparatus. The reason for this is as follows:

For example, in the case of a reduction optical exposure apparatus having a reducing magnification of 1/5, a pattern on a mask to be transferred to a wafer has a size five times larger than the size of a pattern to be printed on the wafer. Therefore, the size to be required in the control of dust or foreign particles is relatively large and thus, the control on the mask is relatively easy. However, in current X-ray exposure apparatuses, a pattern of a mask is transferred to a wafer by unit magnification, whereas the linewidth of the pattern to be reproduced on the wafer is narrower (e.g. ¼) than that of a pattern printed in a conventional exposure method. This necessitates control for dust or foreign particles, to a small size (e.g 1/20, on the mask surface) as compared with that in the past This raises a problem that such dust or foreign particles, with which no inconvenience is caused in conventional apparatuses, cannot be disregarded.

As an example, in the conventional apparatus, for loading masks from cassette casings for each mask, a corresponding cassette casing has to be opened. Thus, there arises a possibility that dust or foreign particles produced at that time from a hinge, for example, or dust or foreign particles blown off from a part adjacent the opening are attached to the mask. The dust or foreign particles produced on that occasion, even if they are of a small size, raise a problem in an X-ray exposure apparatus.

It is accordingly a primary object of the present invention to provide a mask cassette and a mask cassette loading device by which, even in an environment as an X-ray exposure apparatus, for example, wherein the atmosphere is intercepted, the mask cassette loading can be made with a simple structure and without causing deposition of dust or foreign particles even of small size to the mask.

In accordance with an aspect of the present invention, to achieve this object, there is provided a mask cassette and a mask cassette loading device which can be used in a chamber isolated from the atmosphere. The mass cassette is adapted to keep a plurality of masks therein and is held by a specific means which is adapted to open/close a cover for a major part (base) of the mask cassette This specific means is made as a unit with a conveying means for conveying the major part of the mask cassette to a predetermined site. Such a site is set above the position at which the mask cassette is held before its cover is opened. The chamber is equipped with pressure measuring means and an introducing, inlet port for introducing into the chamber, at least one type of gas.

This arrangement can reduce the number of areas or portions that provide a possibility of the creation of dust or foreign particles and, therefore, is effective to maintain cleanness in the chamber. Further, after the mask cassette is opened, the mask is placed at such a site above the preceding position thereof and comes far away from the loader having a high possibility of production of dust or foreign particles. Therefore, the possibility of the contamination of the mask by the dust or foreign particles can be reduced significantly.

Additionally, with this arrangement, it is possible to execute the mask storing or mask loading, without contacting the same with the atmosphere. As a result, it is possible to avoid deterioration of the mask due to reactive gases contained in the atmosphere.

A mask for use in an X-ray exposure apparatus has a structure that an SiN thin film on an Si wafer is held by a ring-like supporting member or an organic film is stretched over a ring-like supporting member, wherein a pattern is formed by a metal such as gold, tungsten or otherwise.

The exposure operation of the X-ray exposure apparatus is made in a reduced pressure on He gas, of an order of 100-200 Torr. The line-and-space (L/S) in X-ray lithography is and an order of 0.25 micron, for example. Because of the unit-magnification exposure, the admitted size of dust or foreign particles becomes smaller with the line-and-space, and even those particles of a diameter of about 0.25 micron are to be considered in relation to the protection to dust.

When a known type mask cassette is used as a cassette for an X-ray mask, the following inconveniences arise.

(1) If, during the mask cassette replacement, a mask is exposed to the atmosphere, there occurs a disadvantage of oxidization due to vapor and $O_2$ in the atmosphere. This causes deterioration of the mask.

(2) The operation of the X-ray exposure apparatus is made in an He chamber, as described. Therefore, it is necessary that the cassette loading is done within the chamber. At this time, as in the example of FIG. 7, if the cassette is of the type for accommodation of a single mask, there is a possibility that each time the cassette loading is made, dust or foreign particles are produced in the chamber.

(3) Protection of the mask cassette against entrance of dust or foreign particles thereinto, during storage thereof, is insufficient.

Accordingly, it is a second object of the present invention to provide a mask cassette suitably usable in an X-ray exposure apparatus, for allowing mask loading isolated from the atmosphere, while reducing to, as small as possible the production of dust or foreign particles while, on the other hand, during mask storing, the atmosphere is intercepted to prevent entrance of dust or foreign particles into the cassette.

In accordance with an aspect of the present invention, to achieve this object, a mask cassette usable in an X-ray exposure apparatus comprises three parts, that is, a cassette major part (base) adapted to keep and hold therein at least two X-ray masks at once, a over part effective to substantially close the cassette major part, and a locking mechanism part for coupling the cassette major part with the cover part at the time of closure.

The cassette major part and the cover part can be accessed only in one direction, and a sealing member is provided at an abutment side. The sealing member providing substantial sealing is designed to withstand at least an external pressure in the closed state. Further, at least one valve is provided for introduction/exhaustion of gas within the cassette.

With this structure, the inside of the cassette can be substantially isolated from the outside gas. Thus, by filling the inside of the cassette with a non-reactive gas, for example, it is possible to avoid deterioration of the mask within the cassette, such as oxidization or otherwise, even if it is kept therein for a long period.

The mask cassette can accommodate therein a plurality of masks, and only one cassette loading operation is required in the chamber of the X-ray exposure apparatus. Therefore, the possibility of dust creation by the loading can be reduced.

Further, since the sealing property is high, entrance of external dust or foreign particles into the cassette can be substantially completely avoided.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
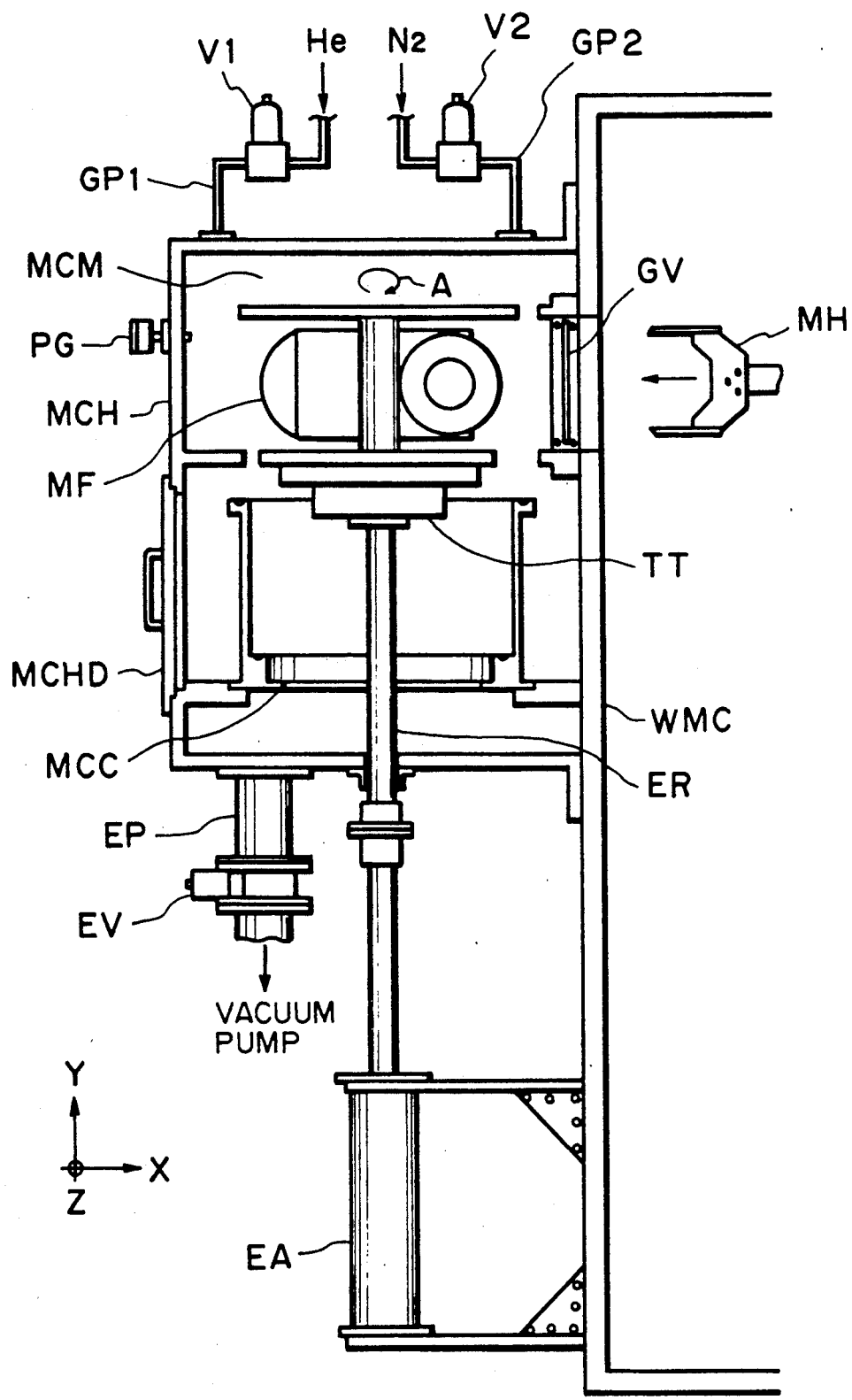
FIG. 1 is a side view of a mask cassette loading mechanism according to a first embodiment of the present invention.

FIG. 1 is a sectional view showing a mask cassette portion and a mask loader portion of an X-ray exposure apparatus into which a mask cassette loading device according to an embodiment of the present invention is incorporated.

Denoted in FIG. 1 at MF is a mask (reticle). The mass MF comprises a ring-like supporting member and a thin film member attached to the ring member. A pattern to be transferred to a semiconductor wafer for manufacture of semiconductor chips, is formed at a central part of the thin film member. The mask MF may have a shape other than a circle.

Denoted at MCM is a major part (base) of a mask cassette for accommodating therein masks MF. In this major part MCM of the mask cassette, a plurality of masks MF, of a number 20, for example, can be accommodated. These masks MF are placed upstanding (with the pattern bearing surface of each mask held parallel to the Y axis) and radially on the X-Z plane. Usually, each mask MF is held immovable by means of a magnetic unit mounted to the mask cassette major part MCM. However, the manner of disposition of the masks MF is not limited to the disclosed example, rather they may be placed so as to lay down. Further, with regard to the holding method, they may be held mechanically.

Denoted at MCC is a cassette cover which covers the mask cassette major part MCM to close the same. In FIG. 1, the mask cassette major part MCM and the cassette cover MCC are illustrated as being separated from each other. However, normally the cassette is closed to provide an integral, hermetically-sealed structure. In this embodiment, the mask cassette has a cylindrical shape. However, it may have a rectangular parallelepiped shape. The sealing is provided by using an O-ring or a U-shaped packing. Thus, when the mask cassette provides an integral structure, there is substantially no flow of gas between the inside and the outside. Details of the mask cassette will be explained in a later part of this Specification.

Denoted at TT is a turn table coupled to the mask cassette major part MCM, for allowing selection of a desired mask MF. Since the masks MF are disposed radially on the mask cassette major part MCM, with respect to the X-Z plane, for selection of masks MF, the mask cassette major part MCM is rotationally moved in the direction indicated by arrow A, about an axis parallel to the Y axis. As a matter of course, a different mechanism for the mask MC selection may be used if the manner of disposition of the masks MF is different.

Denoted at ER is an elevator rod which is attached to the turn table TT and which is arranged to separate the mask cassette major part MCM from the cassette cover MCC to move the same to a predetermined site, along the Y axis (vertically) at which site the mask MF transfer and reception is to be made.

In this embodiment, the mask cassette major part MCM is moved upwardly in the Y-axis direction while the cassette cover MCC is held immovable. However, the manner of separation differs, in accordance with the structure of the mask cassette, and the vertical separation is not a requisition.

Denoted at EA is an elevator for driving the elevator rod ER, which comprises an air cylinder in this embodiment. However, a hydraulic or other type driving mechanism may be used.

Further, while in this embodiment the turn table TT is moved in the Y-axis direction through the elevator rod ER, the elevator EA may be disposed within a mask chamber MCH. The mask chamber MCH is adapted to isolate the mask or masks MF from the atmosphere, even when the mask cassette major part MCM and the cassette cover MCC are separated.

Denoted at WMC is a main chamber in which X-ray exposure is to be made. The mask chamber MCH and the elevator EA are attached to the main chamber WMC. However, the elevator EA may be attached to the mask chamber MCH.

Denoted at MCHD is a door of the mask chamber MCH. By opening/closing the door MCHD, the loading/unloading or replacement of the mask cassette can be made. Usually, the door MCHD is equipped with an interlocking function.

Denoted at GP1 and GP2 are gas ports connected to the mask chamber MCH. Denoted at V1 and V2 are valves for the gas ports GP1 and GP2, respectively. These valves may be operated manually or electrically.

Denoted at EP is an evacuation port of the mask chamber MCH. The port EP communicates with a vacuum pump, not shown. Evacuation valve EV operates to control the evacuation.

Denoted at PG is a pressure gauge for monitoring the pressure in the mask chamber MCH. Denoted at GV is a gate valve provided between the main chamber WMC and the mask chamber MCH. Each mask MF is conveyed through this gate valve GV into the main chamber WMC.

Denoted at MH is a mask hand which is movable in the X-axis direction to covey each mask MF into the main chamber WCM and to move the same back to the mask cassette main part MCM. The configuration of the mask hand MH can be modified with the shape of the mask MF and, therefore, it is not limited to the disclosed example. For the handling of the mask MF by the mask hand MH, either mechanical clamping or vacuum-chuck clamping may be used. Also, the direction of motion of the mask hand MH can be modified with the shape and structure of the mask cassette.

Figures 2A, 2B:
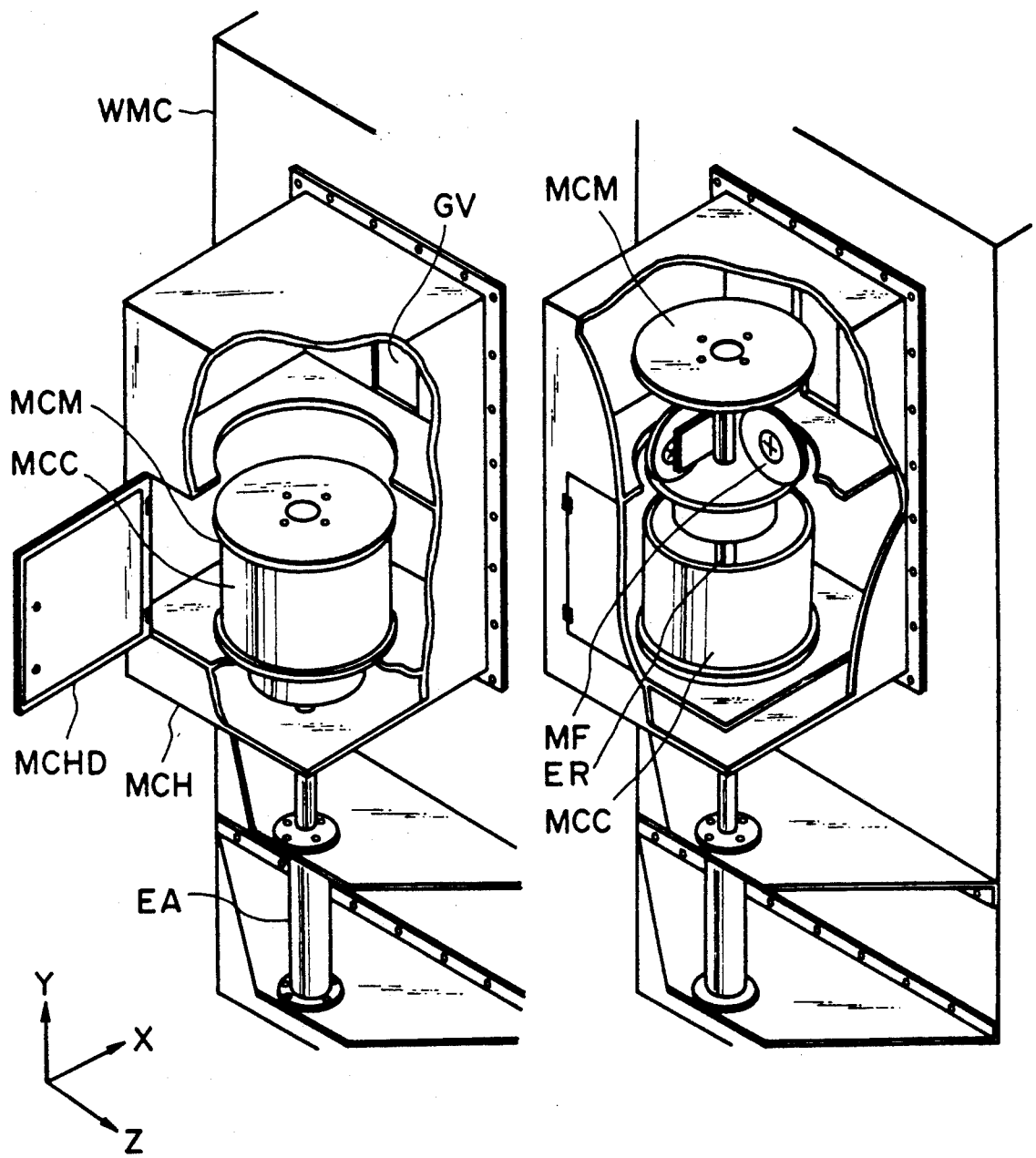
FIGS. 2A and 2B are perspective views, respectively, specifically illustrating the sequence of the mask cassette loading operation.

FIGS. 2A and 2B are perspective views, respectively, of the device of the FIG. 1 embodiment. Referring to FIGS. 1, 2A and 2B, the operation of the device of the present embodiment will be explained in accordance with the sequence.

In FIG. 2A, first the door MCHD of the mask chamber MCH is opened. Then, the mask cassette having the mask cassette major part MCM coupled with the cassette cover MCC is placed on the turn table TT in the mask chamber MCH. Then, the mask cassette major part MCM is secured to the turn table TT, while the cassette cover MCC is secured to the mask chamber MCH. The fixation may be made by using actuator means or, alternatively, it may be made manually. Also, any fixation method is usable. In this embodiment, they are fixed and locked manually.

Subsequently, the door MCHD is closed to close the structure. Then, the evacuation valve EV shown in FIG. 1 is opened and, by using the vacuum pump, the mask chamber MCH is evacuated. The degree of vacuum (pressure) is monitored by using the pressure gauge PG. When the degree of vacuum becomes to a predetermined value, the evacuation valve EV is closed Thereafter, the solenoid valve V2 is opened to allow the flow of a nitrogen ($N_2$) gas from the gas port GP2. The pressure in the mask chamber MCH is thus brought to a predetermined pressure. In the present embodiment, this predetermined pressure is equal to the pressure in the mask cassette, and is set to be equal to the atmospheric pressure (760 Torr), for example. The inside of the mask cassette is set in advance to the atmospheric pressure It will be understood that, in this embodiment, at a moment when the pressure gauge PG detects that the pressure in the mask chamber MCH is at or close to the atmospheric pressure, that is, when the differential pressure between the mask chamber MCH and the mask cassette becomes equal to zero, the solenoid valve V2 is closed. Although the predetermined pressure may be any value, a pressure close to the atmospheric pressure is desirable. If it is close to the atmospheric pressure, only a small force is necessary to hold the cover MCC of the mask cassette.

The aforementioned predetermined pressure of the mask chamber MCH may be set to be slightly lower (e.g. 700 Torr) than that in the mask cassette. On that occasion, the solenoid valve V2 is closed when the pressure gauge PG detects that the pressure in the mask chamber MCH becomes approximately equal to 700 Torr. With this arrangement, when the cover MCC is separated from the cassette major part MCM, a flow of gas round the mask cassette occurs, in a direction outwardly of the cassette major part MCM. Therefore, the possibility of entrance of dust into the cassette major part MCM reduces advantageously.

Subsequently, the elevator EA is actuated to move the elevator rod ER upwardly. The stop position is adjusted in advance by means of the actuator (air cylinder in this embodiment) of the elevator EA. As the elevator ER moves upwardly, as shown in FIG. 2B, the mask cassette major part MCM and the cassette cover MCC are separated from each other and, additionally, the mask MF is brought to a position as shown in FIG. 1, at which it can be handled by the mask hand MH.

Then, in order to evacuate the mask chamber MCH filled with nitrogen $N_2$ the evacuation valve EV is opened and evacuation is made by means of the vacuum pump (not shown) until a predetermined pressure is established. After it is confirmed through the pressure gauge PG that the pressure in the mask chamber MCH becomes to the predetermined pressure, the evacuation valve EV is closed, and the solenoid valve V1 is opened. Then, from the gas port GP1, helium (He) is introduced into the mask chamber MCH. When it is confirmed through the pressure gauge PG that the pressure in the mask chamber MCH becomes substantially equal to that in the main chamber WMC, the solenoid valve V1 is closed to stop the introduction of the helium (He).

After completion of a series of operations described above, the gate valve GV for communicating the main chamber WMC and the mask chamber MCH is opened. The mask hand MH in the main chamber WMC moves into the mask chamber MCH so as to convey, into the main chamber WMC, the mask MF set at the selection position by the turn table TT. After the hand grasps the mask MF, it brings the mask into the main chamber WMC.

Next, description will be made of the procedure for taking the mask cassette out of the mask chamber MCH, for replacement of the same after the X-ray exposure or for the shut-down of the apparatus.

First, a mask MF which is in the main chamber WMC is moved back to a predetermined mounting position in the mask cassette major part MCM and, thereafter, the gate valve GV for communicating the main chamber WMC with the mask chamber MCH is closed.

Then, the evacuation valve EV is opened and, by means of a vacuum pump (not shown) the mask chamber MCH is evacuated. When the pressure gauge PG detects a predetermined pressure, the evacuation valve EV is closed and promptly, the solenoid valve V2 is opened to introduce nitrogen ($N_2$) into the mask chamber MCH. When the pressure gauge PG detects that the pressure in the mask chamber MCH becomes a predetermined pressure, the solenoid valve V2 is closed. In this embodiment, this pressure is set to be equal to the atmospheric pressure (760 Torr). This is because, in order to separate the mask cassette major part MCM from the mask cassette cover MCC as the mask cassette is placed outside the mask chamber MCH, if the difference between the inside pressure and the atmospheric pressure is large, a large force is required for the separation, resulting in a difficulty. However, it is not always necessary that the inside pressure is set to be equal to the atmospheric pressure.

Subsequently, the elevator EA is actuated to move the elevator rod ER downwardly. As a result of the downward movement of the elevator rod ER, the mask cassette major part MCM is coupled with the cassette cover MCC, such that the inside of the mask cassette is sealingly filled with a nitrogen ($N_2$) ambience of 760 Torr. After the inside of the mask chamber MCH is rendered to be at the outside pressure, the door MCHD is opened. In this embodiment, a purge valve is provided, while not shown in the drawings The locking of the mask cassette major part MCM and the turn table TT as well as the locking of the cassette cover MCC and the mask chamber MCH are released, and the mask cassette is taken out of the mask chamber MCH.

It is a possible alternative that, after the mask cassette major part MCM is coupled with the cassette cover MCC, the pressure in the mask chamber MCH is adjusted to be slightly higher (e.g. by about 10 Torr) than the outside pressure. On that occasion, after the mask cassette major part MCM is coupled with the cassette cover MCC, the solenoid valve V2 is opened so that nitrogen ($N_2$) is supplied from the gas port GP2. As the pressure gauge PC detects that the pressure in the mask chamber MCH becomes higher, by 10 Torr, for example, than the outside pressure, the solenoid valve V2 is closed. Also, on that occasion, the solenoid valve V2 is opened as the door MCHD is opened, whereby the nitrogen ($N_2$) can be continuously supplied into the mask chamber MCH from the gas port GP2. This is done so as to prevent mixture of the external gas into the mask chamber, as the door MCHD is opened, to avoid introduction of dust or foreign particles into the mask chamber MCH.

While the present embodiment uses helium (He) gas and nitrogen ($N_2$) gas, the nitrogen ($N_2$) gas may be replaced by an inert gas such as argon (Ar), for example. Although only helium (He) may be used to simplify the gas line to a one-line system to thereby allow omission of a part of the procedure, it is not so desirable, because the sealing of helium (He) is not easy. In the present embodiment, nitrogen ($N_2$) is used in consideration of cost and danger.

The mechanism and the sequential operation according to the present embodiment, described hereinbefore provide the following advantageous effects:

(1) From beginning to end, each mask MF does not contact the atmosphere. This reduces deterioration or otherwise of the mask MF. This is because the ambience contains substantially no vapor, reactive gas and the like which are included in the atmosphere.

(2) Each mask can be protected against dust or foreign particles. As described hereinbefore, the mask MF should be protected with certainty against dust or foreign particles. In this embodiment, a plurality of masks MF are kept, as a group, in the mask cassette major part MCM. In the conventional example, plural cassettes should be prepared for the respective masks. Therefore, each time a mask MF is accessed, a corresponding cassette should be opened and closed. In the present embodiment, as compared therewith, the opening/closing is made only at the time of loading of the mask cassette and, in the course of the operation, the cassette opening/closing is not necessary. Therefore, the production of dust can be reduced. As a result, it is possible to maintain the cleanness in the mask chamber MCH.

(3) The position of the mask hand MH for transfer and reception of a mask MF is set above the mechanism for loading the mask cassette cover MCC, and therefore, any dust or foreign particles produced from the mask cassette MCC during loading by the mask hand MH are difficult to be deposited to the mask MF. As a result, the possibility of mask MF deterioration due to the loading of the cassette cover MCC is reduced.

(4) The opening and closing of the mask cassette in the described sequence makes it easy to control the gas and pressure in the mask cassette.

Next, description will be made of a mechanism for loading a mask cassette of a type different from that described in the foregoing.

Figure 3:
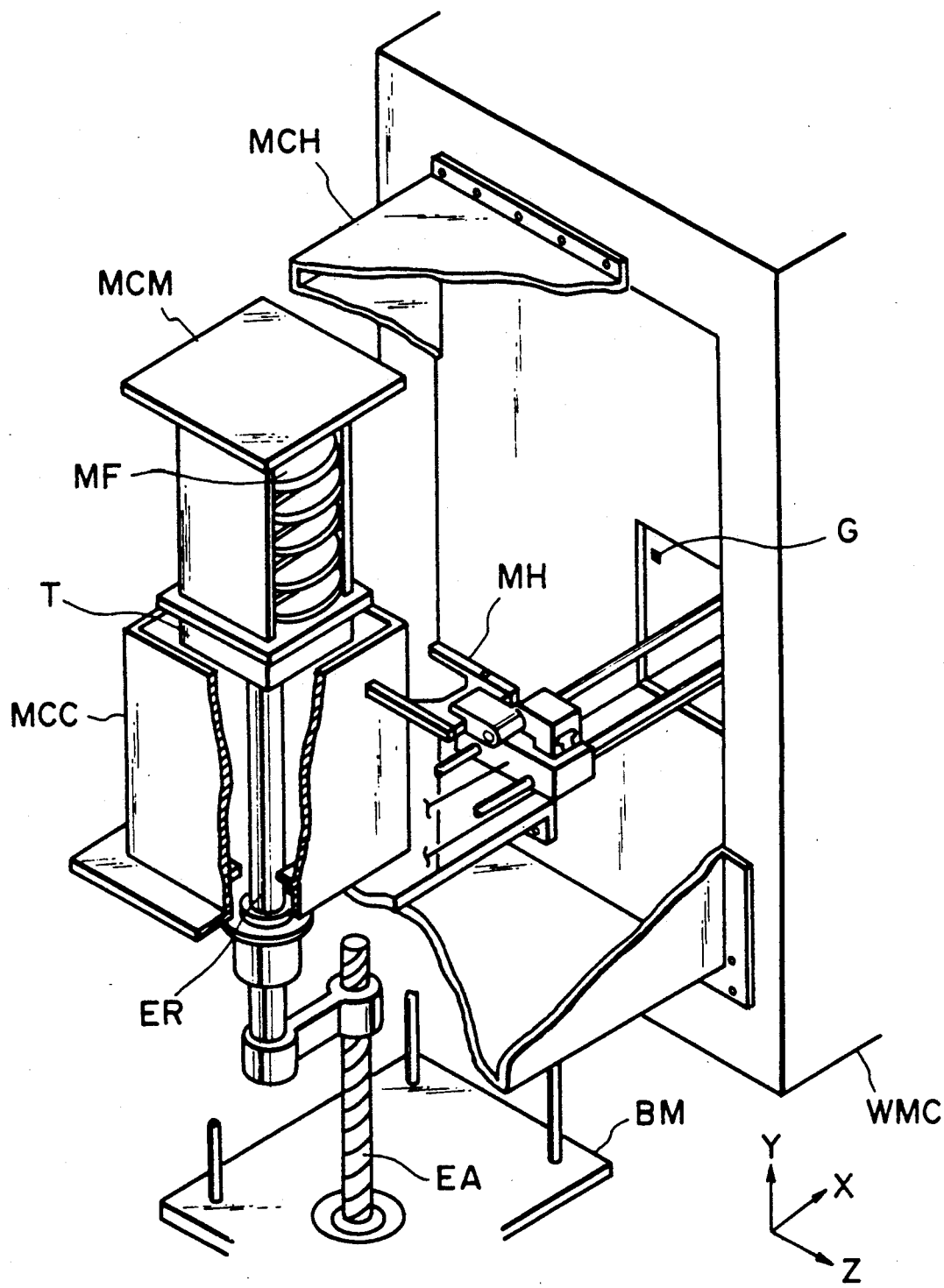
FIG. 3 is a perspective view of a mask cassette loading mechanism according to a second embodiment of the present invention.

FIG. 3 is a perspective view of a cassette loading mechanism according to a second embodiment of the present invention. Denoted at MCH is a mask chamber which is illustrated in this Figure in a partial view.

Explanation will be mainly made to the features different from the FIG. 1 embodiment.

In FIG. 3, denoted at MCM is a mask cassette major part. In this embodiment, a plurality of masks MF are held to be laid down (with the pattern bearing surface of each mask MF extending parallel to the X-Z plane namely, a horizontal plane), with a predetermined interspacing in the Y-axis direction maintained between adjacent masks. A mechanical holding mechanism is used. Denoted at T is a table for carrying thereon the mask cassette major part MCM. Denoted at ER is an elevator rod which is a supporting rod for moving the table T upwardly and downwardly along the Y axis. Denoted at EA is an elevator which provides a driving mechanism for the elevator rod ER. In this embodiment, a ball-screw feeding mechanism is used, the ball-screw being driven by a stepping motor (not shown). Denoted at BM is a motor base plate to which the step motor is mounted. In the present embodiment, a large part of the elevator EA is disposed outside the mask chamber MCH, and a drive is transmitted through the elevator rod ER into the mask chamber MCH.

Denoted at MH is a mask hand. In the present embodiment, the mask hand MH executes a gripping action, by using a plunger, for handling a mask MF. Denoted at WMC is a main chamber, and at G is a gate opening. Through this gate opening G, the mask chamber MCH and the main chamber WMC communicate with each other. Each mask MF is conveyed through this gate opening G into the main chamber WMC. At this time, the mask hand MH is actuated by means of a wire and an operationally associated guide.

Further, those elements corresponding to the gas port GP, evacuation port EP, pressure gauge PG and the like of the FIG. 1 embodiment, are attached to a main chamber wall WMC, although they are not illustrated.

The operation procedure of the mechanism shown in FIG. 3 will be explained, mainly with respect to the differences from the foregoing embodiment.

First, the door MCHD of the mask chamber MCH is opened, and the mask cassette having its mask cassette major part MCM and mask cassette cover MCC coupled to each other to seal the inside, is placed on the table T. Thereafter, the door MCHD is closed and the main chamber WMC is evacuated by vacuum to a predetermined pressure. Since the main chamber WMC is in communication with the mask chamber MCH through the gate opening G, these chambers are always controlled at the same pressure. Therefore, as a result of the evacuation of the main chamber WMC, the mask chamber MCH is also evacuated. Thereafter, a helium (He) gas is introduced from a gas inlet (not shown) until a predetermined pressure is established. Subsequently, the elevator EA starts the upward movement of the table T. At this time, the position of mask MF transfer with the hand MH is at a predetermined height, and, to this position, a desired mask MF is moved. Since, in this embodiment, the elevator EA comprises a ball-screw feeding mechanism, it can also serve as a positioning mechanism. Namely, it has both the function of a separation mechanism for the mask cassette major part MCM and the mask cassette cover MCC and the function of a selection mechanism for masks MF.

After a predetermined exposure operation in the main chamber WMC is completed, all the masks MF are kept in the mask cassette major part MCM. Then the elevator EA moves the mask cassette major part MCM downwardly so as to couple the same with the mask cassette cover MCC. Then, the main chamber WMC is opened to the atmosphere. The mask cassette of the present embodiment is designed to be resistive to the external pressure, and after the mask cassette cover MCC is coupled with the mask cassette major part MCM, the cassette is substantially hermetically sealed. Therefore, the inside of the mask cassette can be held by a helium (He) gas of a predetermined pressure. Subsequently, the door MCHD of the mask chamber MCH is opened, and the mask cassette is taken out. With the procedure described above, the loading is accomplished.

In the second embodiment, in addition to the advantageous effects of the first embodiment, the main chamber WMC and the mask chamber MCH communicate with each other. Therefore, there is an advantage that each of the evacuation system and the gas introduction system comprises a one-line system. Also, since no gate valve is provided, the number of areas having a possibility of dust creation is reduced.

Additionally, since the elevator EA also serves as a mask selecting mechanism, no mask cassette loading mechanism is present in the mask chamber MCH. This results in a reduction in power of the mechanism as well as a reduction in the number of areas having a possibility of dust creation. Therefore, it is possible to maintain high cleanness in the mask chamber MCH.

The cassette loading mechanism according to the present embodiment, described in the foregoing, provides the following advantageous effects:

(1) The possibility of deposition of dust or foreign particles to a mask can be reduced, with an advantage of prevention of mask deterioration as well as the prolongation of the lifetime of the mask.

(2) The mask cassette loading mechanism can be simplified in the chamber, with an advantage with regard to space and cost.

Figure 4:
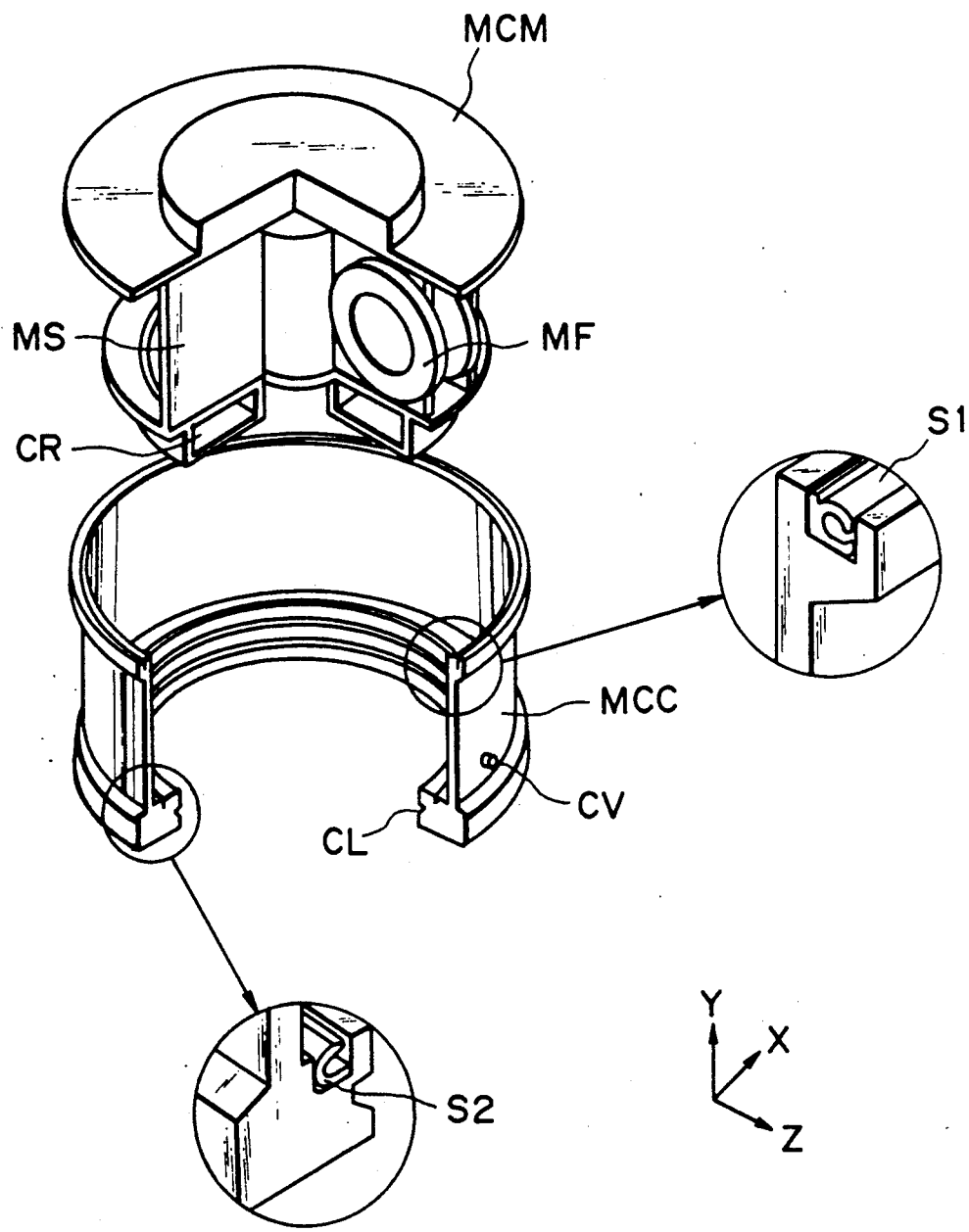
FIG. 4 is a perspective view, showing the appearance of an X-ray mask cassette according to an embodiment of the present invention.

FIG. 4 is a partially broken perspective view, showing the appearance of a mask cassette according to an embodiment of the present invention. The mask cassette of this example, can be incorporated into the mask cassette loading device having been described with reference to FIG. 1.

In FIG. 4, denoted at MCM is a cassette major part, and at MCC is a cover. The separation of the cassette major part MCM and the cover MCC is made either by upward detachment of the cassette major part MCM from the cover MCC or by downward detachment of the cover MCC from the cassette major part MCM. Denoted at MS are mask stages, and at MF are X-ray masks.

In the present embodiment, twenty mask stages MS are disposed upstanding, radially on the X-Z plane (with each mask MF holding surface being parallel to the Y axis), so that masks MF of a number 1–20 can be accommodated on the mask stages MS. The manner of disposition of the mask stage MS is not limited to the radial form, and they may be juxtaposed on the X-Z plane. Further, they may be disposed either upstanding or laid down (with each holding surface extending in parallel to the X-Z plane). Moreover, mask stages of a number more than 20 may be used. While in the present embodiment, the masks MF are held in accordance with a magnetic attraction method, they may be held mechanically or by any other method.

Character CR denotes the location at which a cassette locking mechanism is accommodated. Details of this will be explained later.

Character S1 denotes a sealing member at the top of the cover MCC, and character S2 denotes a sealing member at the bottom of the cover MCC. Each of these sealing members S1 and S2 are provided along the circumference of a corresponding opening of the cover MCC. As illustrated in enlarged parts of FIG. 4, the sealing members S1 and S2 are adapted to be resistive to the external pressure. This is desirable for the following reason: First, once the cassette major part MCM and the cover MCC are coupled to provide a closed casing, the pressure in the cassette is determined. If, in this case, the outside pressure is higher than the inside pressure of the cassette, due to the differential pressure, the outside gas is going to enter into the cassette. If, however, it is designed to be resistive to the outside pressure, the hermetically sealed state in the cassette can be retained. If, on the other hand, the outside pressure is lower than the inside pressure of the cassette, due to the differential pressure, the gas in the cassette is going to leak outwardly. However, although the external pressure resisting design involves a possibility of outward emission of gas of a small amount, it is different from the entrance of the outside gas into the cassette. Further, the motion of dust or otherwise resulting from such a flow resides in a direction, raising no practical problem with respect to the protection of the mask MF. Accordingly, in this embodiment, the orientation of the sealing member is designed to be resistive to the outside pressure.

Each of the sealing members S1 and S2 has a sealing surface which faces, such as shown in FIG. 4, in the direction (Y-axis direction) in which the cassette major part MCM and the cover MCC are separated or coupled. Namely, no sealing surface is provided at the side of sliding motion therebetween. This is effective to avoid sliding contact of the sealing members S1 and S2 to any portion, until the sealing surface is abutted. As a result, production of dust does not occur.

Denoted at CV is a purge valve which, in this embodiment is opened and closed manually Also, by using a joint, it can be connected to an introducing/evacuating system. Although for replacement of the mask MF during storage, the cassette major part MCM and the cover MCC are separated from each other, they are coupled again after the replacement. On that occasion, the purge valve CV can be used for the replacement of the gas within the cassette. The cover MCC may be provided with a plurality of purge valves.

Figure 5:
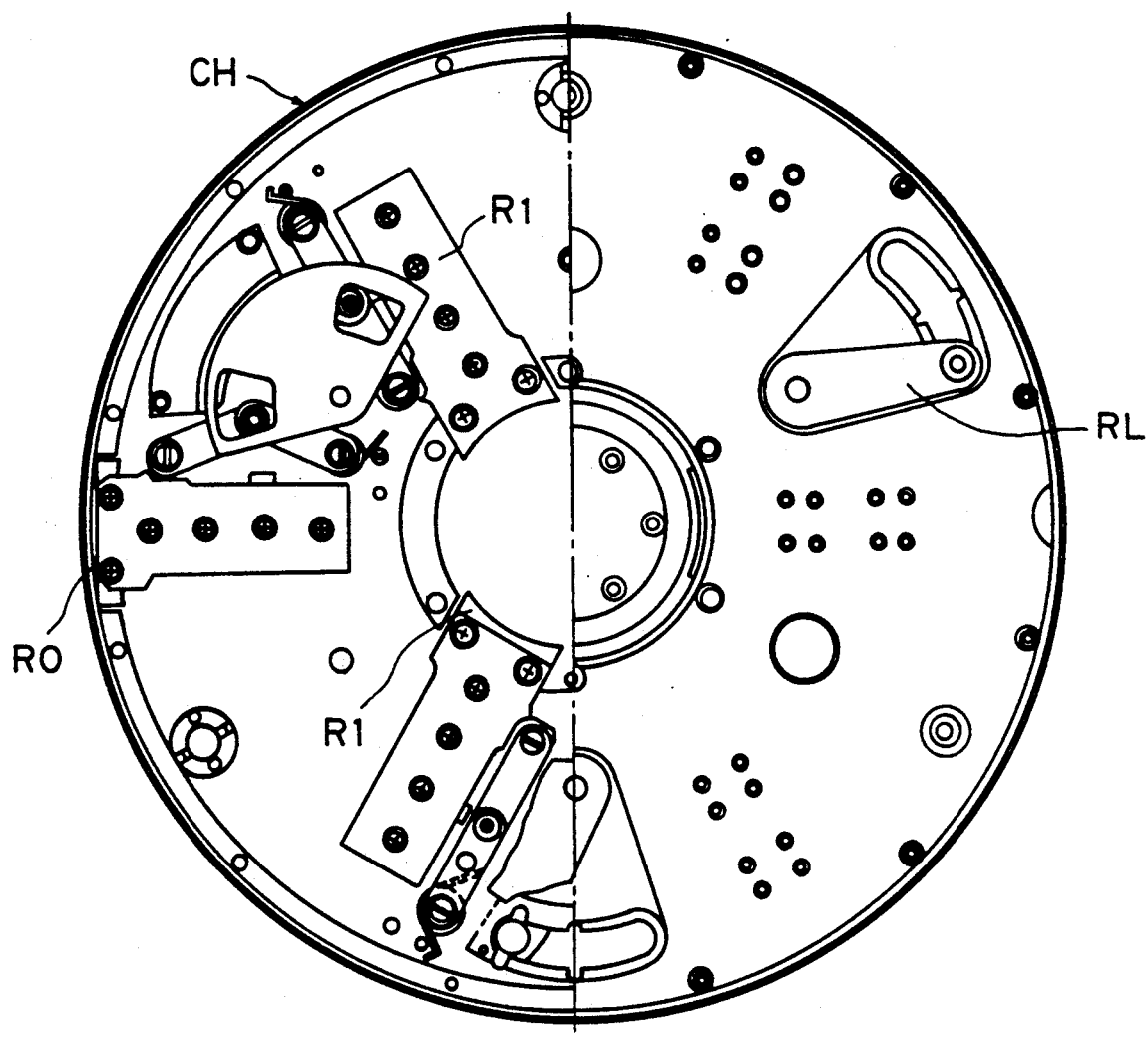
FIG. 5 is a plan view, showing a locking mechanism of the mask cassette.

FIG. 5 is a plan view showing details of a cassette locking mechanism CR. FIG. 5 shows the cassette major part MCM of the FIG. 4 embodiment, as viewed from below in FIG. 4, the left-hand half of FIG. 5 depicting the cassette with its outer shell being removed.

In FIG. 5, denoted at RO is a pawl for coupling the cover MCC with the cassette major part MCM; and at RI is a pawl for coupling the cassette major part MCM with the table TT (FIG. 1) on which the cassette major part MCM is to be placed. The pawl RO is provided to couple the cassette major part MCM with the cover MCC to maintain them in a sealed state, but any other means such as screws may be used. While one pawl RO and two pawls RI are shown in this Figure, actually there are provided three pawls RO and three pawls RI, disposed equidistantly. Further, although the present embodiment uses pawls RI, they may be omitted.

Denoted at RL are levers for actuating the pawls RO and RI. As the lever RL rotates, the pawls RO and RI are caused to be moved, in an inverse positional relationship, so that they go out and come back into the cassette major part MCM. When the pawl RI is accommodated in the cassette major part MCM, the pawl RO goes into a groove CL below the cover MCC, shown in FIG. 4, such that the cassette major part MCM and the cover MCC are coupled to each other and the sealed state is retained.

While in this embodiment the pawls RI and RO are actuated simultaneously by the rotation of the levers RL, any other means may be used as such an associating mechanism. Further, these levers RL or any other means to be used in place of the levers RL, may be actuated manually or by using an actuator. Further, when the actuator drive is used, the actuator may be disposed in the cassette major part MCM or outside thereof. In the present embodiment, an actuator is provided outside the cassette, and the levers RL are actuated through a transmission pin (not shown).

The cassette locking mechanism CR is provided at a position, distinguished from the closed part of the cassette. Since the cassette locking mechanism CR includes a portion having a possibility of dust production, desirably it is disposed below the cassette major part MCM, as in the present embodiment.

The sequence of the loading operation for the mask cassette of the present embodiment, will now be explained. The cassette is filled in advance with an $N_2$ gas or otherwise and is hermetically sealed, and masks MF of a required number are prepared inside the cassette.

First, the cassette is separated in the chamber MCH shown in FIG. 1 into the cassette major part MCM and the cover MCC. Then, only the cassette major part MCM is moved to a site to which the mask hand MH shown in FIG. 1 is accessible. Here, the actuator (not shown) provided in the chamber MCH and for driving the lever RL, serves to assist the separation of the cassette major part MCM and the cover MCC. After the exposure is completed, once the chamber MCH is filled with $N_2$ (to a pressure 760 Torr equal to the atmospheric pressure). After this, the cassette major part MCM and the cover MCC are coupled to each other. Accordingly, at this moment, the inside of the cassette can be filled with a desired gas and pressure, and is sealed. The coupling is assisted by the actuator (not shown) in the chamber MCH. Subsequently, the door MCHD of the chamber MCH is opened and the cassette is taken out for storage.

The present embodiment provides the following advantageous effects:

(1) Use of the sealing members S1 and S2 can substantially isolate the inside of the mask cassette from the atmosphere. Therefore, by filling the cassette with a non-reactive or non-harmful gas such as $N_2$, deterioration of an X-ray mask MF such as oxidization or otherwise does not occur even if it is kept in the cassette for a long period.

(2) A plurality of masks MF can be accommodated, as a group, in the cassette. Thus, the separation or coupling of the cassette major part MCM and the cover MCC has to be done only once within the chamber. This reduces the possibility of dust production and maintains cleanness in the chamber and in the cassette.

(3) The cassette has a external pressure resisting design and has a high reliability with regard to the degree of hermetic sealing. Therefore, any external dust or foreign particles do not enter the cassette.

(4) In the present embodiment, the masks MF are held upstanding by using a magnetic attraction method. This is particularly advantageous, because any dust or foreign particles are difficult to be deposited on the mask MF.

Figure 6:
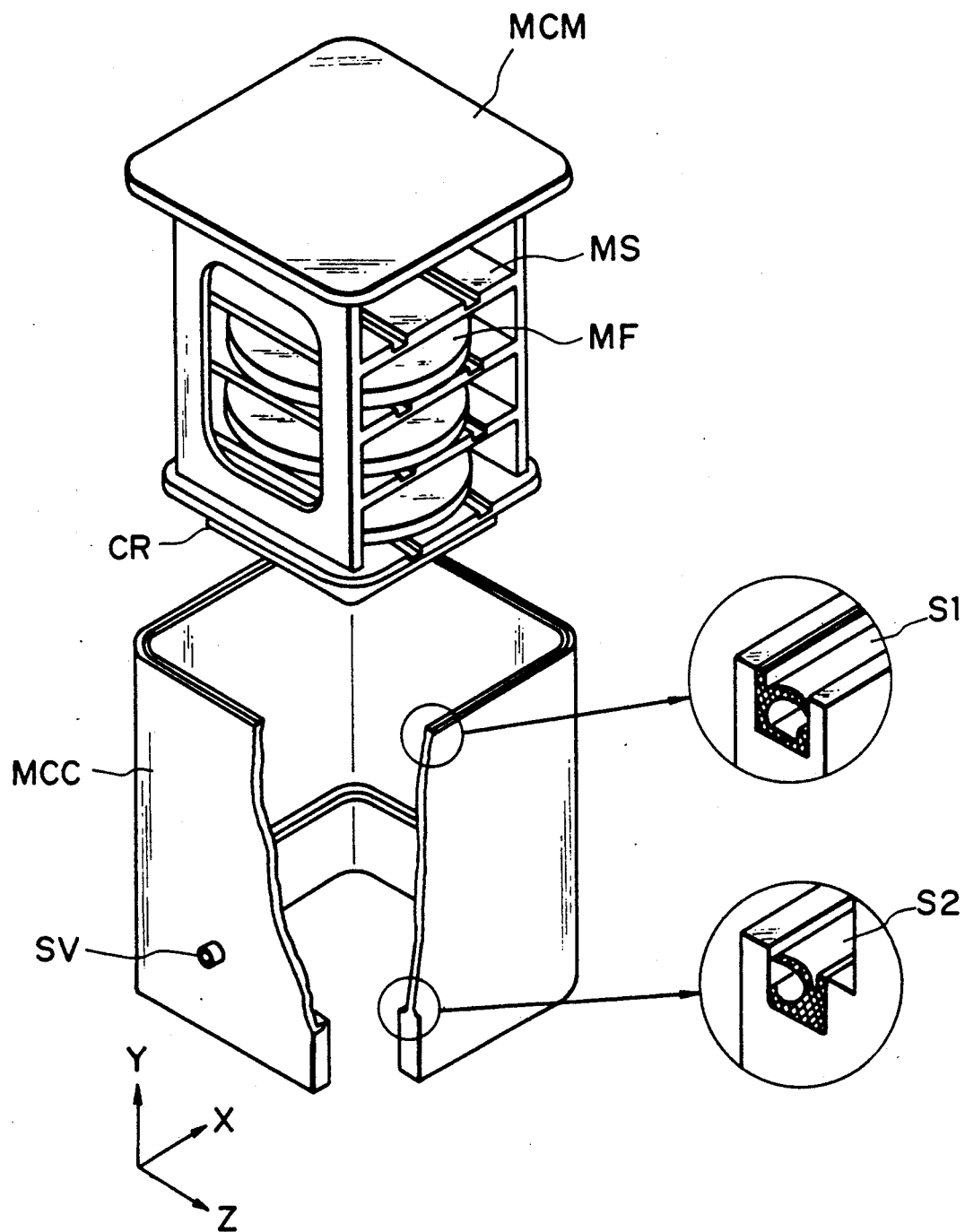
FIG. 6 is a perspective view, showing the appearance of an X-ray mask cassette according to another embodiment of the present invention.
Figure 7:
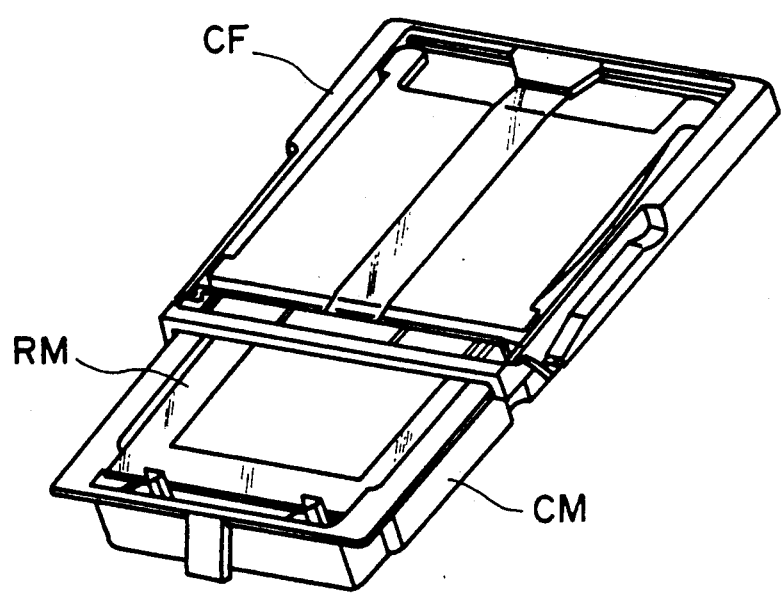
FIG. 7 is a perspective view showing a known type mask cassette.

FIG. 6 is a partially broken perspective view, showing the appearance of a mask cassette according to a further embodiment of the present invention. This embodiment differs from the foregoing embodiment with respect to the manner of holding the X-ray masks. The mask cassette of the present embodiment can be incorporated into the device shown in FIG. 3.

In FIG. 6, character MCM denotes a mask cassette major part and character MS denotes mask stages. Character MF denotes X-ray masks used in this embodiment, and character MCC denotes a cover. Character S1 denotes a sealing member which is provided at the top of the cover MCC, and character S2 denotes a sealing member provided at the bottom of the cover MCC. These sealing members serve to hermetically seal the cassette major part MCM.

Denoted at SV is a purge valve, and at CR is a cassette locking mechanism accommodating portion for coupling the cassette major part MCM and the cover MCC after the closure.

The sequence of operation of the present embodiment is substantially the same as that of the foregoing embodiment.

In the present embodiment, the masks MF are laid down and are simply placed on respective mask stages MS. A mask hand MH (see FIG. 3) is inserted into a groove formed in a corresponding mask stage MS, to lift a corresponding mask MF upwardly and convey the same.

As compared with the foregoing embodiment, the present embodiment is advantageous in the point that: As described, each mask MF is laid down and, therefore, in contrast to the magnetic attraction method, there is no necessity of providing a magnetic unit in the mask stage MS.

As described in the foregoing, a mask cassette according to the present invention provides the following advantages:

(1) Since the cassette can be hermetically sealed against the atmosphere, deterioration of a mask due to the atmosphere or contamination of the mask by dust or otherwise can be reduced, with an advantage of prolongation of the lifetime thereof.

(2) Accommodating masks as a group is effective to reduce the cassette loading operations in the chamber and, therefore, the cleanness in the chamber can be maintained.

While the invention has been described with reference to the structures disclosed herein, it is not confined to the details set forth and this application is intended to cover such modifications or changes as may come within the purposes of the improvements or the scope of the following claims.

What is claimed is:

1. A device for loading a mask cassette for accommodating therein, a mask for use in the manufacture of semiconductor chips, said device comprising:
   a chamber isolated from a surrounding atmosphere; and
   a driving mechanism for separating, in said chamber, the mask cassette into a cassette major part and a cover, said driving mechanism comprising means for moving the cassette major part and the cover relative to each other, to position the cassette major part above the cover after separation.

2. A device according to claim 1, wherein said driving mechanism further comprises means for vertically moving the cassette major part.

3. A device according to claim 1, wherein said chamber is provided with an inlet for introducing at least one type of gas into said chamber, and a pressure gauge for measuring the pressure in said chamber.

4. A device according to claim 3, wherein the gas introduced into said chamber comprises at least one of nitrogen, helium and argon.

5. A mask cassette, comprising:
   a base portion for holding at least two X-ray masks;
   a cover portion disengageably engageable with said base portion for enclosing the masks held by said base portion when said cover portion is engaged with said base portion; and
   a locking mechanism for selectively locking said base portion and said cover portion when engaged, said locking portion being provided in a downstream direction, away from the direction in which said cover portion is disengaged from said base portion.

6. A cassette according to claim 5, further comprising a sealing member provided at an abutment between said cover portion and said base portion.

7. A cassette according to claim 6, wherein said sealing member is resistive to at least outside pressure when said cover portion is engaged with said base portion.

8. A cassette according to claim 5, wherein said cover portion is provided with at least one valve.

9. A device according to claim 1, wherein said driving mechanism comprises a drive source disposed outside of said chamber.

10. A mask cassette according to claim 5, wherein said base portion comprises means for vertically holding the mask.

11. A dust-protective mask loading method for use with an X-ray lithographic apparatus for manufacturing semiconductor devices, said method comprising the steps of:

provviding a mask cassette, having a base member for supporting thereon a plurality of masks to be used in the lithographic apparatus, and a casing member, disengageably engageable with the base member, to define a substantially closed space for accommodating the masks therein;

introducing the mask cassette, accommodating the plurality of masks therein, into a substantially gastight chamber through a door closeable opening of the chamber;

providing a predetermined gas ambience in the chamber subsequent to introducing the mask cassette into the chamber in said introducing step;

relatively moving the base member upwardly, relative to the casing member, to disengage the base member from the casing member; and unloading a mask from the base member and loading the unloaded mask at a predetermined position in the chamber for use in the X-ray lithographic apparatus.

12. A method according to claim 11, further comprising effecting disengagement of the base member from the casing member by a driving force generated outside of the chamber.

13. A method according to claim 11, further comprising supporting the masks by the base member along vertical planes in the mask cassette.

* * * * *

UNITED STATES PATENT AND TRADEMARK OFFICE
CERTIFICATE OF CORRECTION

PATENT NO. : 5,026,239

DATED : June 25, 1991

INVENTOR(S) : Yuji Chiba, et al

It is certified that error appears in the above-identified patent and that said Letters Patent is hereby corrected as shown below:

```
On the Title page, In the Abstract:
Line 6, "plurality" should read --plurality of--.

Col 1, line 28, "removed" should read --is removed--;
      line 66, "therein" should read --therein.--.

Col 2, line 2,  "closed" should read --closed.--;
      line 17, "pressure" should read --pressure.--;
      line 26, "vacuum" should read --a vacuum--;
      line 48, "past" should read --past.--.

Col 3, line 10, "cassette" should read --cassette.--;
      line 15, "introducing," should read --introducing--;
      line 16, "introducing" should read --introducing,--;
      line 24, "pro-" should read --the pro- --;
      line 34, "that" should read --such that--;
      line 42, "and" should read --on--.

Col 4, line 9,  "over" should read --cover--.
Col 5, line 1,  "mass" should read --mask--.
Col 6, line 26, "covey" should read --convey--;
```

UNITED STATES PATENT AND TRADEMARK OFFICE
CERTIFICATE OF CORRECTION

PATENT NO. : 5,026,239

DATED : June 25, 1991

INVENTOR(S) : Yuji Chiba, et al

It is certified that error appears in the above-identified patent and that said Letters Patent is hereby corrected as shown below:

```
Col 6,  line 57, "to" should be deleted;
        line 58, "closed" should read --closed.--;
        line 67, "pressure" should read --pressure.--.

Col 7,  line 18, "round" should read --around--;
        line 26, "elevator" should read --elevator rod--;
        line 32, "N_2" should read --N_2,--;
        line 37, "to" should be deleted.

Col 8,  line 12, "a" should be deleted;
        line 24, "drawings" should read --drawings.--.

Col 11, line 2,  "example," should read --example--;
        line 24, "embodiment," should read --embodiment--;
        line 45, "retained" should read --retained.--;
        line 68, "manually" should read --manually.--

Col 12, line 50, "desir-" should read --it is desir- --;
        line 51, "it is" should be deleted;
        line 54, "embodiment," should read "embodiment--;
        line 66, "once" should be deleted.
```

UNITED STATES PATENT AND TRADEMARK OFFICE
CERTIFICATE OF CORRECTION

PATENT NO. : 5,026,239

DATED : June 25, 1991

INVENTOR(S) : Yuji Chiba, et al

It is certified that error appears in the above-identified patent and that said Letters Patent is hereby corrected as shown below:

Col 13, line 23, "a" should read --an--.

Signed and Sealed this

Sixth Day of April, 1993

*Attest:*

STEPHEN G. KUNIN

*Attesting Officer*       *Acting Commissioner of Patents and Trademarks*